(12) United States Patent
Matusek et al.

(10) Patent No.: US 11,146,712 B2
(45) Date of Patent: Oct. 12, 2021

(54) METHOD FOR MANUFACTURING CAMERA MODULES AND A CAMERA MODULE ARRAY

(71) Applicant: Robert Bosch GmbH, Stuttgart (DE)

(72) Inventors: Adrian Severin Matusek, Stuttgart-Rohr (DE); Andreas Kugler, Alfdorf (DE); Stefan Apelt, Gerlingen (DE); Ulrich Schaaf, Kaisersbach (DE)

(73) Assignee: Robert Bosch GmbH, Stuttgart (DE)

( * ) Notice: Subject to any disclaimer, the term of this patent is extended or adjusted under 35 U.S.C. 154(b) by 242 days.

(21) Appl. No.: 16/133,201

(22) Filed: Sep. 17, 2018

(65) Prior Publication Data

US 2019/0089877 A1   Mar. 21, 2019

(30) Foreign Application Priority Data

Sep. 21, 2017 (DE) .......................... 102017216708.4
Jul. 3, 2018 (DE) .......................... 102018210909.5

(51) Int. Cl.
*H01S 4/00* (2006.01)
*H04N 5/225* (2006.01)
*H01L 27/146* (2006.01)

(52) U.S. Cl.
CPC ..... *H04N 5/2254* (2013.01); *H01L 27/14618* (2013.01); *H01L 27/14683* (2013.01); *H04N 5/2253* (2013.01); *H04N 5/2257* (2013.01); *H04N 5/2258* (2013.01)

(58) Field of Classification Search
CPC .. H04N 5/2253; H04N 5/2254; H04N 5/2257; H04N 5/2258; H01L 27/14618; H01L 27/14683
See application file for complete search history.

(56) References Cited

U.S. PATENT DOCUMENTS

| 6,223,667 | B1 * | 5/2001 | Ono ...................... | D05B 35/068 112/470.34 |
| 7,926,159 | B2 * | 4/2011 | Tsai ...................... | G03B 17/02 29/407.04 |
| 8,248,523 | B2 * | 8/2012 | Chua .................... | H04N 5/2251 348/374 |
| 8,777,474 | B2 * | 7/2014 | Shim ................. | G02F 1/133606 362/620 |
| 8,976,291 | B2 * | 3/2015 | Chen .................... | H04N 5/2257 348/374 |

(Continued)

FOREIGN PATENT DOCUMENTS

| CN | 106961537 A | 7/2017 |
| DE | 20308308 U1 | 8/2003 |

(Continued)

*Primary Examiner* — Paul D Kim
(74) *Attorney, Agent, or Firm* — Norton Rose Fulbright US LLP; Gerard Messina

(57) ABSTRACT

A method for manufacturing a camera module array, made up of at least two camera modules, each camera module including a circuit carrier, an image sensor and at least one optical element, including: mounting the image sensor on the circuit carriers;
applying a protective layer to the circuit carriers, the image sensors not being covered by the protective layer or being left exposed; and mounting the optical elements on the image sensors with the aid of an injection molding process and/or embossing process.

23 Claims, 6 Drawing Sheets

(56) References Cited

U.S. PATENT DOCUMENTS

| | | | |
|---|---|---|---|
| 8,981,619 B2 * | 3/2015 | Kimura | H02N 2/001 |
| | | | 310/323.16 |
| 9,065,991 B2 * | 6/2015 | Galstian | H04N 5/2254 |
| 9,393,747 B2 * | 7/2016 | Watanabe | B29C 43/021 |
| 9,431,442 B2 * | 8/2016 | Vittu | H04N 5/2257 |
| 10,798,277 B2 * | 10/2020 | Bochow | H04N 5/2253 |
| 2002/0020555 A1 * | 2/2002 | Daido | H05K 3/403 |
| | | | 174/261 |
| 2010/0053407 A1 * | 3/2010 | Crisp | H01L 27/14636 |
| | | | 348/311 |
| 2010/0246928 A1 * | 9/2010 | Takahama | G07D 7/2075 |
| | | | 382/140 |
| 2011/0216238 A1 | 9/2011 | Fujii et al. | |
| 2014/0053986 A1 * | 2/2014 | Chou | B32B 37/10 |
| | | | 156/580 |
| 2014/0059822 A1 * | 3/2014 | Chen | B23P 21/004 |
| | | | 29/38.9 |
| 2016/0037097 A1 * | 2/2016 | Duparre | H01L 29/127 |
| | | | 348/241 |
| 2016/0306195 A1 * | 10/2016 | Miyoshi | B29D 11/00644 |
| 2020/0264093 A1 * | 8/2020 | Campbell | G01N 17/02 |

FOREIGN PATENT DOCUMENTS

| | | |
|---|---|---|
| DE | 102006006113 A1 | 8/2007 |
| DE | 202013012118 U1 | 4/2015 |
| DE | 102015213575 A1 | 8/2016 |
| JP | 2005268967 A | 9/2005 |

\* cited by examiner

METHOD FOR MANUFACTURING CAMERA MODULES AND A CAMERA MODULE ARRAY

RELATED APPLICATION INFORMATION

The present application claims priority to and the benefit of German patent application no. 10 2017 216 708.4, which was filed in Germany on Sep. 21, 2017, and German patent application no. 10 2018 210 909.5, which was filed in Germany on Jul. 3, 2018, the disclosure which are incorporated herein by reference.

FIELD OF THE INVENTION

The present invention relates to a method for manufacturing camera modules and a camera module array.

BACKGROUND INFORMATION

Multiple methods are already believed to be understood from the related art for manufacturing camera modules, for example, from DE 10 2006 006 113 A1.

SUMMARY OF THE INVENTION

The present invention describes a method for manufacturing a camera module, made up of at least two camera modules, each camera module including a circuit carrier, an image sensor and at least one optical element, including the steps:
  mounting the image sensors on the circuit carriers
  applying a protective layer to the circuit carriers, the image sensors not being covered by the protective layer or being left exposed;
  mounting the optical elements on the image sensors with the aid of an injection molding process and/or an embossing process.

The fact that the image sensors are not covered by the protective layer means, in particular, that the active surfaces of the image sensors are not covered. Since the protective layer may be impervious to light, this would otherwise potentially result in an impairment of the sensors. Border areas of the image sensors may also be overlaid by the protective layer, so that such embodiments also fall within the scope of protection.

Thus, at least portions, in particular, optically active portions of the image sensors, must be left exposed or must not be covered by the protective layer.

This method offers the advantage that the electronics of the manufactured camera modules are fully protected with this method from environmental influences. In addition, as a result of targeted function integration and the use of functional material, very few process steps and individual parts are required. In addition, the structure is configured in a simple and space-saving manner. As a result, it is possible with the aid of this method to cost-efficiently manufacture ultra-small camera sensors in large formats.

Additional advantages of the method are a high reliability due to a compact configuration and a fully casted structure, an exposure of optically active surfaces during packaging of the image sensor directly on the sensor carrier or a system circuit board and the possibility of manufacturing camera modules in large format and, therefore, cost-efficient circuit panels. A planar assembly technology may also be used for equipping the integrated components, in part also with a narrow grid dimension. With the encapsulation of sensitive components and systems during the molding process, a high degree of reliability of the camera module is achieved as a result of the protection of the components. A high packing density is also achieved, if, in addition, electronic components are integrated into the circuit carrier using embedding technologies. The equipping of the camera modules on foils in the roll-to-roll method or on circuit boards in large panels is also enabled. In this method, the brand new foil is unwound from a roll and at the same time the foil already used is rewound again on a second roll. Very rapid clock cycles are possible with the aid of this method.

Instead of or in addition to the injection molding process, an embossing process may also be used for embossing the lenses. In this case, the cavity of the LPM package may initially be completely or partially filled with a paste-like lens material and the lens material is subsequently hardened using an UV process and/or thermosetting process via exposure and/or a heated punch process.

This specific embodiment of the method offers the advantage that the optical window of the imager may be measured and in this way the embossing punch may be very precisely aligned with the optical window in the x, y and z-position prior to the filling of the cavity. An insertion in a corresponding tool with its tolerances is completely omitted. A lens stack formation is also possible.

In another specific embodiment of the method, the circuit carriers are configured as a foil. The foil in this case is, in particular, a glass fiber-reinforced epoxy resin foil, to which strip conductors are applied.

This specific embodiment of the present invention offers the advantage that a very cost-efficient production of the camera module is enabled. The foil may be very thin and may have a thickness of less than 250 µm, in particular, less than 210 µm, further in particular less than 200 µm. Foils reinforced with glass fibers, in particular, lend themselves as circuit carriers. The base substance of the foils may be formed, for example, by epoxy resin. The foils may optionally also be equipped with strip conductors, which are manufactured, for example, in known circuit board technology. The strip conductors may be manufactured, for example, from copper or from a comparable material.

In another specific embodiment of the method, the circuit carrier is constructed of at least two layers, at least one electronic component being embedded between the layers. The individual layers in this case may be configured, in particular, as conductor foils, which may be fabricated, in particular, as reinforced with glass fibers and made of epoxy resin. To manufacture the circuit carrier, these foils may be laminated. At least one electrical component, for example, a processing unit, is mounted between at least two foils. Multiple electronic components may also be installed or embedded between the layers.

This specific embodiment of the method offers the advantage that very compact camera modules are manufacturable, since surface areas provided for these are no longer needed on the surface of the circuit carrier due to the embedding of the additional optical components.

In another specific embodiment of the method, the method includes the additional step of attaching soldering points on the camera modules. The soldering points in this case are configured, in particular, as soldering bumps.

These soldering points may optionally be applied after a removal of the tool panel. The attachment in this case takes place, for example, on the rear side of the circuit board. As an alternative to attaching soldering bumps, another contacting, for example, with plugs or the like, may also be carried out.

In another specific embodiment of the method, the camera modules are mechanically connected to one another. In this case, the circuit carriers of the camera modules, in particular, are connected to one another. The circuit carriers in this case are connected to one another via a cohesive conductor foil and/or circuit board or are formed by this conductor foil and/or circuit board.

This method offers the advantage that all camera modules are fabricated on a shared, mechanically connected substrate and, as a result, multiple camera modules may be simultaneously processed with the aid of one method step. This increases the clock cycle for manufacturing the camera modules, thereby enabling a more cost-efficient and more rapid manufacturing. The shared substrate may be, in particular, a conductor foil, which at the same time forms the circuit carriers of the individual camera modules. Alternatively, it is also conceivable that the camera modules are mechanically connected to one another as a result of being applied to a shared substrate, for example, to a foil that is decoupled from the electronics of the camera modules. As a result of this as well, the camera modules may be jointly processed and the indicated advantages achieved.

In another specific embodiment of the method, the camera module array is fabricated on a conductor foil and is made up of at least four camera modules. The camera modules in this case are situated, in particular, in rows and columns.

This specific embodiment of the present invention offers the advantage that multiple camera modules, in turn, may be processed simultaneously and, in addition, these multiple camera modules are aligned in such a way that a precise processing is made possible. Corresponding tools may be fabricated using predefined templates, which make a reliable and high precision fabrication possible. It is also possible in such an arrangement to easily separate the camera modules, for example, with the aid of a milling cutter or a saw. The camera modules in this case may be situated, for example, in at least two rows and two columns, further, in particular, in at least 10 rows and 10 columns.

Alternatively, it is also possible for the modules to be situated in merely one row. Different arrangements may be advantageous depending on the circuit board and/or conductor foil and tool used.

In another specific embodiment of the present invention, the protective layer is applied with the aid of a local pressure molding process, in which a molding compound is added to a separating foil and subsequently pressed locally onto the circuit carrier and/or onto the components mounted on the circuit carrier.

The separating foil in this case may be situated in such a way that it spans a molding tool, so that this tool does not come into contact with the molding compound. As a result, the separating foil separates the molding tool from the molding compound. Since the separating foil is also fitted in between the molding tool and the camera module, this foil offers the advantage that it protects the camera module from damage, which may result when the molding tool directly contacts the camera module. Contamination of the tool and of the sensor with molding compound is also prevented, as a result of which the molding process may be carried out more rapidly on the one hand, and more reliably on the other hand. Locally, here means, in particular, that the pressure is not applied uniformly to the circuit carrier, but is applied locally at noncritical points. This is ensured, for example, by leaving particular areas of the sensor carrier exposed. In addition, the pressure application may take place with the aid of individual cylinders, the surface area of which is smaller than that of the circuit carrier, as a result of which different pressures are present in the intermediate spaces between two pressure cylinders, than those directly below the pressure cylinders.

Moreover, this specific embodiment of the present invention offers the advantage that a highly precise application of the molding compound or of the protective layer to the electronic components and to the circuit board is enabled. At the same time, the use of this method allows for the omission of predefined areas, which are therefore not covered by the molding compound. In this way, it is possible to leave active areas of the image sensor exposed, so that an optimum image quality may be ensured. In addition, the contact pressures in the local pressure molding process may be adapted in such a way that no damage to the camera modules results. The protective layers made of molding compound applied with the aid of this method may have different thicknesses. Layers of approximately 1 mm in thickness have proven advantageous. However, the thickness may be varied depending on the particular application. In this method, protective layer thicknesses are applied, in particular, having a thickness of less than 1.5 mm, in particular, less than 1.1 mm, in particular of less than 1 mm.

The components mounted on the circuit carrier may be arbitrary electronic components. These may, for example, be chips such as, for example, processors and/or diodes and/or strip conductors.

In another specific embodiment of the present invention, the molding compound is impervious to light in a cured state. The molding compound in this case is made, in particular, of epoxy resin.

This specific embodiment of the present invention offers the advantage that the circuit carrier and, if necessary, elements situated on the circuit carrier, are protected from irradiation, media, temperature stresses, etc. This may increase the service life and the reliability of the camera modules. Instead of epoxy resin, it is also possible to use other materials, which exhibit comparable material properties.

In another specific embodiment of the present invention, the optical elements are shaped as lenses in the injection molding process and/or embossing process. A lens may also be understood to mean merely an optically active layer, which exhibits few or no curvatures.

This specific embodiment of the present invention offers the advantage that all lenses may be manufactured in an automated manner in one process and simultaneously mounted. As a result, no individual equipping by hand or machine is necessary. In this way, manufacturing costs may be saved and the production time shortened.

To manufacture and simultaneously mount the lenses in the injection molding process, the injection compound, which may, for example, be a liquid silicone rubber (LSR), may either be merely injected into the exposed areas, or distributed over the entire surface area of the camera modules. The local injection into the exposed surface areas offers the advantage that less material is required. In contrast, fewer injection nozzles may be used when extensively applying the injection compound.

In another specific embodiment of the method, a contour stamp is used to shape the lenses, so that the lenses have a concave, convex or plane-parallel shape.

This specific embodiment of the present invention offers the advantage that, depending on the particular application, it is possible to equip the camera modules with different lenses. In this way, different camera modules may be manufactured with the aid of the same method, depending on the requirements. Merely the contour stamp need be replaced.

In another specific embodiment of the method, a microstructuring is introduced onto the lens surfaces.

This specific embodiment of the present invention offers the advantage that a contour is applied to the lenses during the manufacturing process, which produces additional positive optical properties. A microstructuring may be applied, for example, which exhibits anti-reflective properties.

In another specific embodiment of the method, this method includes the additional step of mounting optical system holders on the camera modules.

This specific embodiment of the present invention offers the advantage that it is possible to manufacture complete camera modules, including an optical system holder and, if necessary, a housing in a very compact configuration.

A method for manufacturing a camera module, a camera module array initially being manufactured according to the method described above and the method including the additional step of separating the camera modules, in particular with the aid of a milling cutter and/or a saw.

This specific embodiment of the present invention offers the advantage that the method delivers finished camera modules, which may be installed in this form directly in cameras or camera systems.

DETAILED DESCRIPTION

Figure 5:
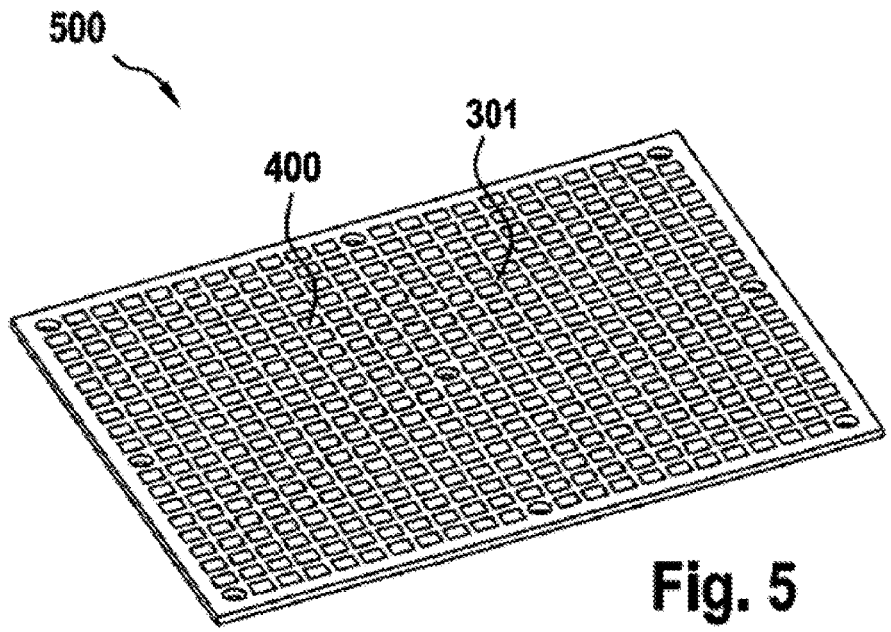
FIG. 5 shows a finished camera module array on a carrier foil.

FIG. 5 depicts by way of example, a finished camera module array 500. Camera module array 500 has been manufactured on a cohesive conductor foil, which in this exemplary embodiment forms a shared circuit carrier.

Figure 4:
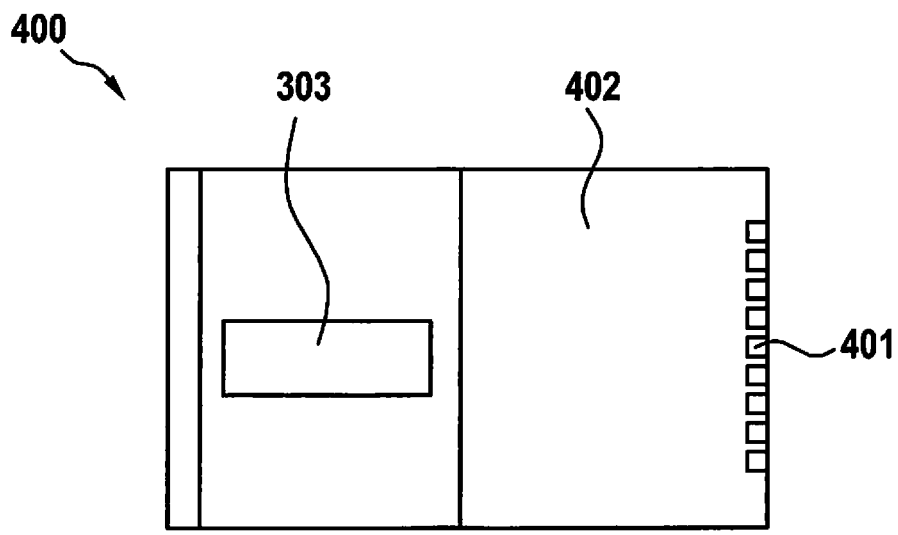
FIG. 4 shows a camera module after a molding process.

Camera module array 500 is made up of multiple camera modules 400, which may assume different dimensions and shapes. Depicted by way of example in FIG. 4 is a camera module 400 made up of a circuit carrier, an image sensor 303 and at least one optical element. Camera module 400 is largely covered by molding compound 402. Only the area above image sensor 303 and the area at contact points 401 were left exposed during the molding process. Depending on the exemplary embodiment, it is also possible for only the area above sensor image 303 to be left exposed, for example, if contact points 401 are located laterally and/or on the rear side of the circuit carrier (i.e., not on the side on which the image sensor is mounted). The optical element is not visible due to its transparency, but is situated directly in front of or on image sensor 303.

Figure 3:
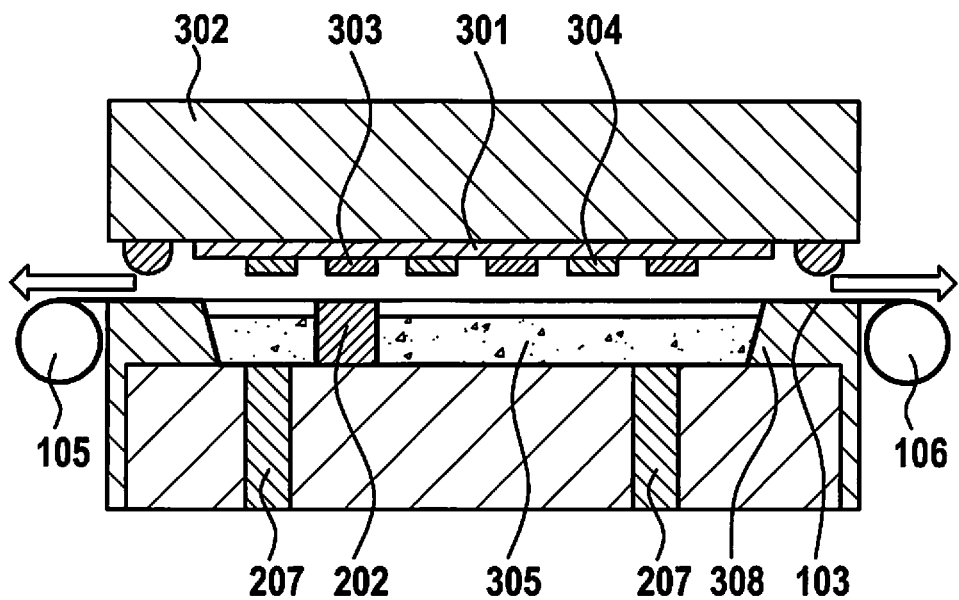
FIG. 3 shows a sectional view of a camera module in a tool.

The molding process incorporated in the manufacturing process of the camera module arrays is depicted by way of example in FIG. 3. A sectional image is depicted, which shows by way of example the application of molding compound 305 on an area of circuit carrier 301. An image sensor 303 is mounted on the circuit carrier. Additional electronic components 304 are also situated on circuit carrier 301, in this exemplary embodiment, multiple processing units.

To apply molding compound 305, the circuit carrier is mounted on a pressing plate 302. In this exemplary embodiment, the circuit carrier is held in position by applying a negative pressure (suction) to pressing plate 302.

A foil 103 is placed on a lower tool part 308, which is unwound from a roll 105 and is rewound again on an additional roll 106. In this way, a rapid equipping of the lower tool part with unused foil 103 may be implemented once the molding process is completed. No contaminations of the tool result and molding compound residues potentially remaining on the foil do not influence and/or soil the camera modules that are processed in a subsequent molding process.

Lower tool part 308 includes at least one cavity, into which molding compound 305 is added after foil 106 is applied. In order to leave particular areas of circuit carrier 301 or of individual components 303 on circuit carrier 301 exposed or not to cover with molding compound, webs 202 may be inserted at specific points in lower tool part 308. With the aid of these webs 202, it may be ensured that no molding compound 305 is pressed onto image sensor 303, and the image sensor remains exposed.

In order to prevent air pockets under the molding compound, a vacuum is generated or the air density is reduced in this exemplary embodiment between lower tool part 308 and pressing plate 302, or, the camera module. Molding compound 305 is subsequently pressed locally with the aid of compression cylinders 207 onto circuit carrier 301 and onto components 304 mounted on circuit carrier 301.

Figure 2:
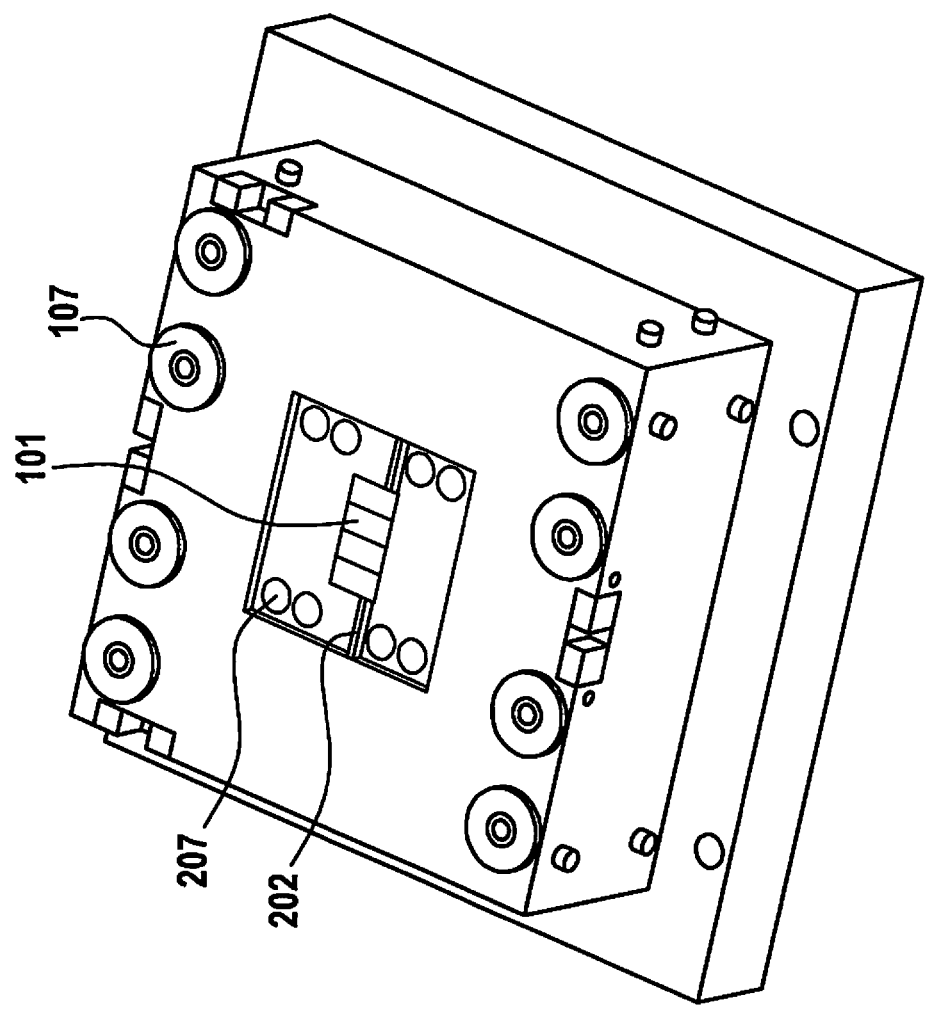
FIG. 2 shows a camera module array in a tool (foil is not depicted).

The tool used for the "local pressure molding" is depicted once again in FIG. 2. In order to establish a spacing between lower tool part and pressing plate 302 optimal for the method, additional spacing elements 107, the height of which may be varied, may be placed on lower tool part 308. In the structure depicted in FIG. 2, a camera module array made up of four camera modules 101 is manufactured. The sealing web 202 for the seal (gap) of the detection area of image sensors 303 is also visible.

Figure 1:
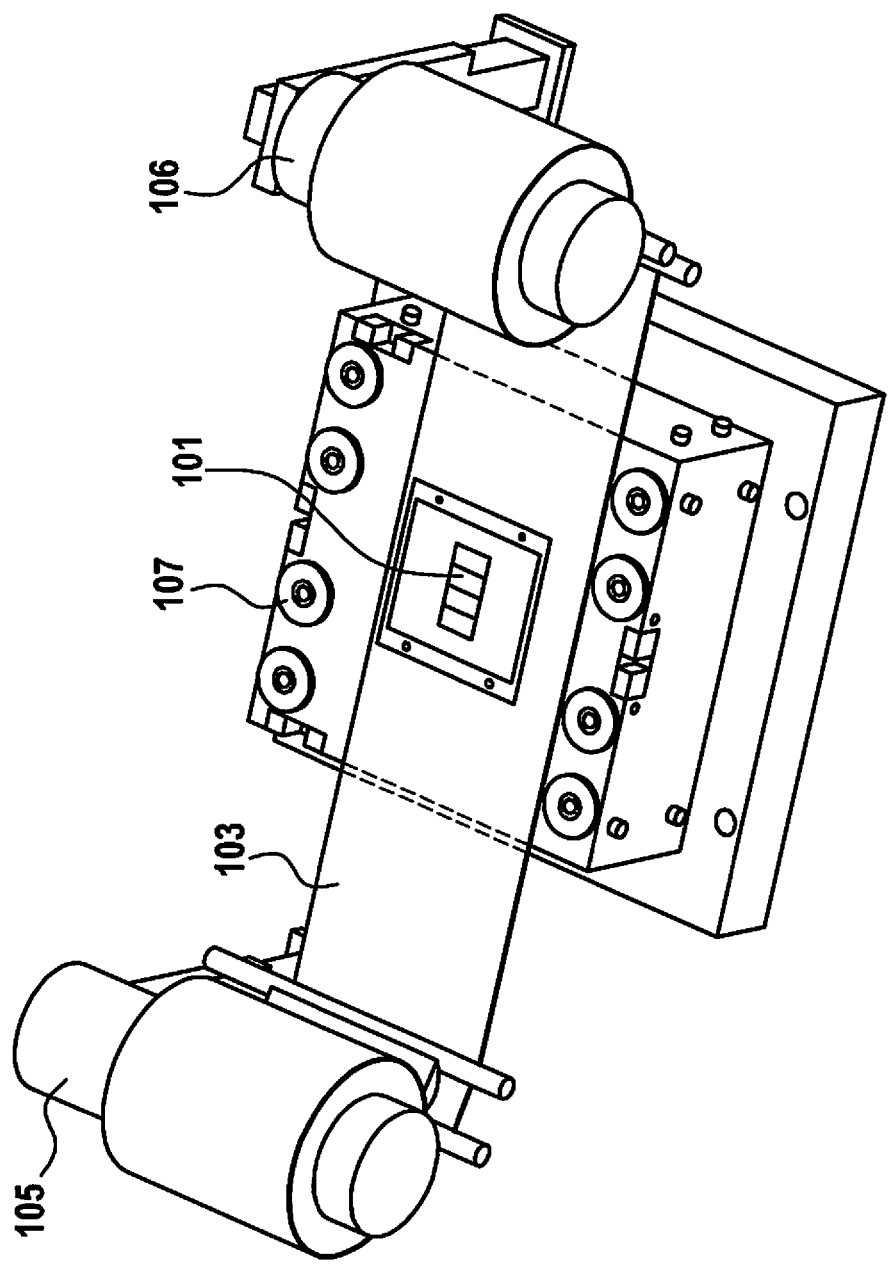
FIG. 1 shows a tool for manufacturing a camera module array.

The tool for applying molding compound 305 to sensor carriers 301/electronic components 304, including rolls 105, 106 for foil 103 is also depicted once again in FIG. 1.

Figure 6:
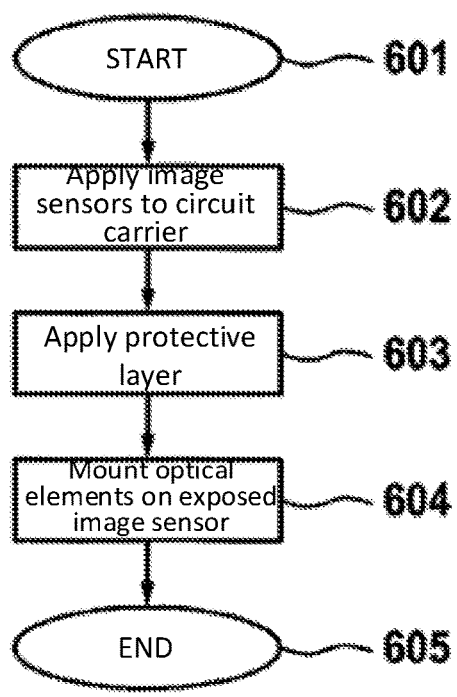
FIG. 6 shows a schematic method diagram.

In FIG. 6, the method sequence of one exemplary embodiment of the method for manufacturing a camera module array 101 is depicted. A camera module array 101, in this case made up of at least two camera modules, in this exemplary embodiment of four camera modules, each camera module including a circuit carrier 301, an image sensor 303 and at least one optical element. The method starts in step 601.

In step 602, image sensors 303 are applied to circuit carrier 301. In this exemplary embodiment, circuit carrier 303 is implemented by a conductor foil, onto which strip conductors have already been galvanically applied.

In step 603, a protective layer molding compound 808 is applied as a protective layer with the aid of a local pressure molding process to circuit carrier 303/the conductor foil and to electrical components 304 mounted on the circuit carrier or conductor foil. In the process, image sensors 303 are not covered by the protective layer formed of the molding compound 808 and are consequently left exposed.

In step 604, optical elements are mounted in the area of image sensor 303 not covered by the protective layer. This takes place with the aid of an injection molding process. The optical elements may be mounted exactly above exposed image sensors 303 with the aid of previously stored reference markers, which mark the locations that have not been covered by molding compound 305.

The method ends in step 605.

In another exemplary embodiment, the method includes the additional step of separating the individual camera modules of camera module array 101. For this purpose, the individual camera modules are separated from one another with the aid of a saw. In another method, a milling cutter is used for such purpose.

In another exemplary embodiment, the method includes the additional step of applying optical system holders to the camera modules of camera module array 101. This results in camera modules, which form fully functioning cameras with virtually no further processing.

In the next exemplary embodiment, another method is described, with the aid of which it is possible to simplify considerably the assembly of cameras for use in automobiles and to implement significantly smaller designs. In this case, a large portion of the electronic components (passive and active components) are embedded in ultra-small design, in what may be ultra-small packages or as bare die in a circuit board for manufacturing the camera modules. Subsequently, an image sensor or image chip is mounted on this circuit board as a flipchip or in chip-on-board (COB) technology. This technology enables the use of only one circuit board in a very compact design. The circuit board thus manufactured in the panel format is then overmolded in the local pressure molding process, the optically active window of the imager component remaining exposed in this process. In another process step, the optical lenses are injection molded onto the molded housing, reference markers previously introduced into the design being referenced.

Figure 7:
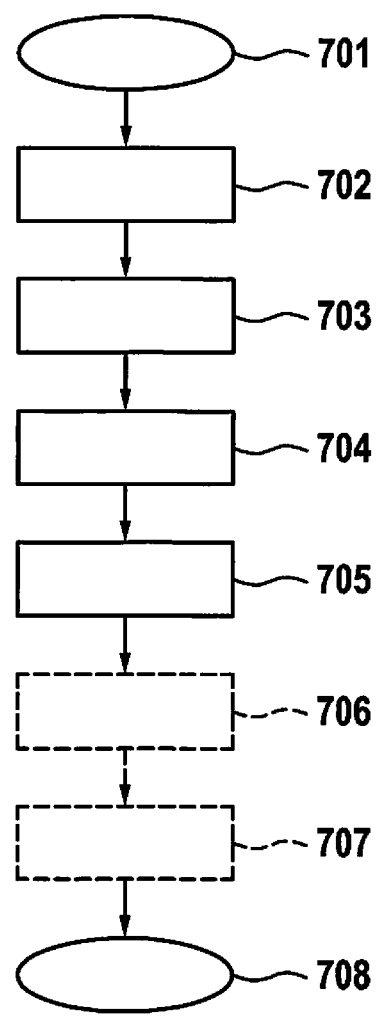
FIG. 7 shows another schematic method diagram.

The method steps required for this method for manufacturing a camera module array are outlined in FIG. 7. The method starts in step 701.

The electronic assembly of the cameras is manufactured in step 702. Here, ultra-small components or also unhoused components (bare dies) are embedded in the circuit boards or mounted on the circuit board for the purpose of miniaturization. Technologies known to those skilled in the art are used in the process. The aim is to implement via these highly integrated electronics and with high reliability the smallest possible installation space.

In step 703, imager chips 303 are mounted in COB technology on the circuit board thus manufactured. In alternative specific embodiments, the chips may also be mounted on this board as a micro ball grid array (pBGA) or as a bare die flip chip.

In step 704, the equipped circuit board is placed in the surface molding tool depicted in FIGS. 1 through 3, or, may be introduced into and fixed in upper tool part 302. In this case, the sensor design is directed downwards. The cavity for molding compound 305 introduced in lower tool part 308 is spanned with a separating foil 103, which is applied to the contour of the cavity via vacuum channels. Molding compound is then metered as liquid or in granulated form into specific areas of the cavity, so that the sensor surfaces are not wetted with molding compound when the tool is closed. Separating foil 103 protects and seals the sensitive sensor surface of imager 303 from molding compound 305. The metered molding compound 305 liquefies as a result of the hot tool surface and the tool may be closed. Before the tool is completely closed, a vacuum is briefly applied to the cavity in order to prevent air pockets in the mold package.

The flow of molding compound 305 in the cavity and the build-up of the internal mold pressure of molding compound 305 is carried out in a defined manner via compression cylinders/pistons 207 in the lower tool part, which press on separating foil 103 from below in an area of the cavity, which is later separated and is therefore not visible on the subsequent individual panels. In this way the exposure of the sensor membranes of imager 303 and a targeted venting of the mold package is achieved.

Optical elements are attached in optional step 705. In this step, individual lenses and/or lens systems are sprayed directly onto the molding compound and onto the optical window of the imager using a spray process. For this purpose, separate markers are used in order to ensure an optimal alignment of the lenses relative to packaged imager 303. A dual-component injection molding tool, as well as an injection molding machine, are used in this exemplary embodiment for injection molding the lens systems. The injection molding machine is equipped with an elastomer aggregate, for example, for liquid silicone rubber (LSR) and with a handling system.

To apply the lenses, camera module array 101 is placed in a first step in the opened injection molding tool via a handling system and is fixed with centering pins and a vacuum in an ejector side. After the tool is closed, camera module array 101 is oversprayed with transparent plastic by opening a cooled needle valve nozzle. In this case, the transparent component is either a liquid silicone or a transparent polyurethane-based or epoxy-based casting compound. The material may, for example, be a Silopren LSR 7092 of Momentive.

The tool cavity may be selectively configured as concave, convex or plane-parallel by changing the contour punch. To render the lens surface non-reflective, a microstructuring may be introduced on the modeling surface of the contour punch, which is optimally modeled by the low-viscosity first component. In this exemplary embodiment, a concave shaping punch is used, which also includes a microstructuring, as a result of which the optical element, once shaped, exhibits non-reflective properties.

The injection molding tool is generally heated with electrical heating cartridges to 120° C. to 180° C., so that a cross-linking of the transparent components is achieved. In order to obtain a better adhesion of the transparent casting compound on the circuit carrier, the circuit carrier in this exemplary embodiment is pre-treated with the aid of plasma or primer. After a predefined cross-linking period, the cast multi-chip module is removed from the tool. At this point, an optical system holder may optionally also be attached to the camera module.

In an optional step 706, soldering bumps 801 required for soldering are attached to the rear side of the circuit board, once the camera module array is removed from the injection molding tool.

In another optional step 707, the finished electronic individual circuits or camera modules are separated from the composite panel or from the camera module array. This may take place via sawing, milling or similar processes, a milling cutter being used in this exemplary embodiment.

The method ends in step 708.

Figure 8:
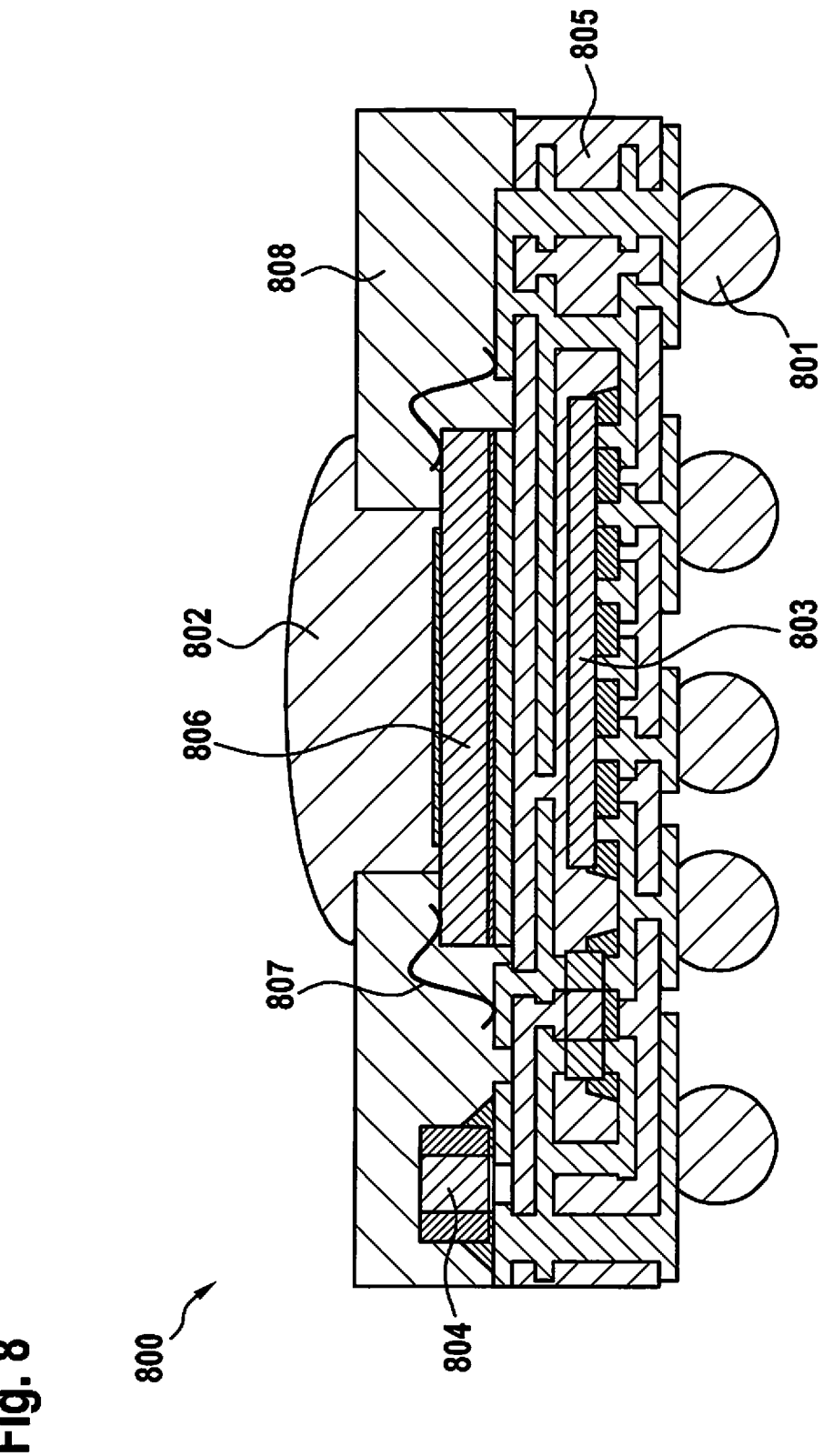
FIG. 8 shows a finished, separated camera module.

In FIG. 8, a finished camera module 800 is imaged once again.

Image sensor 806 in this camera module 800 is mounted on a multi-layer circuit carrier 805. Circuit carrier 805 is made up of multiple layers of conductor foil which, in turn, are constructed of glass fiber-reinforced epoxy resin or are laminated. Additional embedded electrical components 803, which enable a very compact structure of camera module 800, are situated within circuit carrier 805. Also situated on circuit carrier 805, in addition to image sensor 806, is an additional electrical component 804 and electrical terminals 807, which are protected by applied molding compound 808. An optical component 802 has been mounted on the image sensor 806. Soldering bumps 801 are located on the underside for contacting the camera module.

Instead of or in addition to the injection molding process, an embossing process is used in another exemplary embodiment for embossing the lenses. In this case, the cavity of the LPM package is initially completely or partially filled with a paste-like lens material and the lens material is subsequently hardened using an UV process and/or thermosetting process via exposure and/or a heated punching process. The optical window of the image sensor is measured prior to the filling of the cavity with the paste-like material and, based on this measurement, the embossing punch is very precisely aligned with the optical window in the x, y and z-direction.

An insertion in a corresponding tool with its tolerances is completely omitted. A lens stack formation is also possible. Moreover, this process is fully compatible with the aforementioned process steps. This means that a camera module array may be manufactured in one line in the same panel with the aid of the same process chain. The panel is separated here as well only after the manufacture of the individual camera modules is completed.

In another exemplary embodiment, the cavity above the imager is filled with an optically functional plastic, for example, with Delo optical materials (for example, Delo Phobond or Delo Katiobond). The first lens is cured and embossed over the image sensor with the aid of a suitable embossing punch. This punch is transparently configured in this exemplary embodiment so that the material is directly hardened during the punching process with the aid of a UV hardening.

In another exemplary embodiment, a pre-punched lens is mounted directly on the package with the aid of a suitable holder. The lens is mounted with the aid of UV hardening and is hardened in one work step. The manufacture of additional lenses and the formation of a lens stack subsequently take place, the lenses, like the first lens, being mounted on a suitable holder. For this purpose a suitable matrix is used as a holder or holder structure, which has been formed in the LPM process.

With the aid of the method underlying this application therefore, pre-formed lenses may be mounted with and without a holder on the package structure. These lenses may be adhered or else mounted directly with no additional adhesive during the hardening process. The process may be repeated to form additional stackings via appropriately shaped geometries of a holding structure mounted on the lens edge. The holder may also be manufactured from other materials, for example, glass, and the process may proceed in multiple steps.

What is claimed is:

1. A method for manufacturing a camera module array, the method comprising:
    mounting image sensors on circuit carriers, wherein the camera module array includes at least two camera modules, each of the at least two camera modules including a respective one of the circuit carriers and a respective one of the image sensors;
    forming a protective layer by performing a local pressure molding process in which a molding compound is added to a separating foil and is subsequently pressed locally onto the circuit carriers and/or onto components mounted on the circuit carriers, wherein at least a portion of each of the image sensors is not covered by the formed protective layer; and
    mounting on each of the image sensors at least one respective optical element using an injection molding process and/or embossing process.

2. The method of claim 1, wherein the circuit carriers are configured as a foil.

3. The method of claim 1, wherein the circuit carriers are each constructed of at least two layers between which at least one respective electronic component is embedded.

4. The method of claim 1, further comprising:
    attaching soldering points to the at least two camera modules.

5. The method of claim 1, wherein the at least two camera modules are mechanically connected to one another.

6. The method of claim 1, wherein the camera module array is fabricated on a conductor foil and the at least two camera modules include at least four camera modules that are situated in rows and columns.

7. The method of claim 1, wherein the molding compound is impervious to light in a cured state.

8. The method of claim 1, wherein, for the each of the image sensors, the at least one respective optical element is shaped as a lens in the injection molding process and/or in the embossing process.

9. The method of claim 8, wherein a contour punch is used to shape the lenses so that the lenses have a concave, convex or plane-parallel shape.

10. The method of claim 9, wherein a microstructuring is introduced on the lens surfaces.

11. The method of claim 1, further comprising:
    mounting optical system holders on the at least two camera modules.

12. The method of claim 1, wherein the circuit carriers are configured as a glass fiber-reinforced epoxy foil with attached strip conductors.

13. The method of claim 1, further comprising:
    attaching soldering bumps to the camera module.

14. The method of claim 1, wherein the at least two camera modules are mechanically connected to one another, the circuit carriers of the at least two camera modules being connected to one another, and the circuit carrier being formed by a cohesive conductor foil.

15. The method of claim 1, wherein the molding compound is impervious to light in a cured state, the molding compound being made of epoxy resin.

16. The method of claim 1, wherein the circuit carriers of the at least two camera modules are mechanically connected to one another.

17. The method of claim 1, wherein the forming of the protective layer is performed such that, for each respective one of the at least two camera modules are, the protective layer laterally extends at least one of:
    on, and without an air gap separating the protective layer from, the respective circuit carrier of the respective camera module until at least a lateral edge of the respective image sensor of the respective camera module; and
    from a radially exterior region of the respective camera module to a radially interior region of the respective camera module, embedding one or more electrical components of the respective camera module in the radially interior region.

18. The method of claim 17, wherein the forming of the protective layer is performed such that, for each respective one of the at least two camera modules are, the protective layer laterally extends on, and without the air gap separating the protective layer from, the respective circuit carrier of the respective camera module until at least a lateral edge of the respective image sensor of the respective camera module.

19. The method of claim 17, wherein the forming of the protective layer is performed such that, for each respective one of the at least two camera modules are, the protective layer laterally extends from the radially exterior region of the respective camera module to the radially interior region of the respective camera module, embedding the one or more electrical components of the respective camera module in the radially interior region.

20. The method of claim 17, wherein, for each respective one of the at least two camera modules are, at least a portion of the at least one respective optical element of the respective camera module is applied directly onto at least a portion of the respective image sensor of the respective camera module.

21. The method of claim 17, wherein, for each respective one of the at least two camera modules, the at least one respective optical element of the respective camera module is supported by the respective image sensor of the respective camera module.

22. A method for manufacturing a camera module, the method comprising:

manufacturing a camera module array, by performing the following:

mounting image sensors on circuit carriers, wherein the camera module array includes at least two camera modules, each of the at least two camera modules including a respective one of the circuit carriers and a respective one of the image sensors;

forming a protective layer by performing a local pressure molding process in which a molding compound is added to a separating foil and is subsequently pressed locally onto the circuit carriers and/or onto components mounted on the circuit carriers, wherein at least a portion of each of the image sensors is not covered by the formed protective layer; and mounting on each of the image sensors at least one respective optical element using an injection molding process and/or embossing process; and separating the at least two camera modules.

23. The method of claim 22, wherein the separating is performed using a milling cutter and/or a saw.

* * * * *